United States Patent [19]
Uda et al.

[11] Patent Number: 5,515,315
[45] Date of Patent: May 7, 1996

[54] DYNAMIC RANDOM ACCESS MEMORY

[75] Inventors: Akihiro Uda; Akihiko Hashiguchi; Akira Nakagawara, all of Kanagawa, Japan

[73] Assignee: Sony Corporation, Tokyo, Japan

[21] Appl. No.: 360,007

[22] Filed: Dec. 20, 1994

[30] Foreign Application Priority Data

Dec. 24, 1993 [JP] Japan ................................ 5-328340
Jun. 20, 1994 [JP] Japan ................................ 6-137315

[51] Int. Cl.⁶ .................................................. G11C 11/40
[52] U.S. Cl. ...................................... 365/174; 365/230.03
[58] Field of Search ................................ 365/174, 182, 365/189.01, 189.03, 230.01, 230.03

[56] References Cited

U.S. PATENT DOCUMENTS 4,370,280  3/1988  Aoyama ................................ 365/205
5,430,672  7/1995  Kuwabara et al. ............... 365/230.03

FOREIGN PATENT DOCUMENTS

62-123093  6/1986  Japan.

Primary Examiner—Terrell W. Fears
Attorney, Agent, or Firm—Ronald P. Kananen

[57] ABSTRACT

A dynamic random access memory, in which a connection switch circuit is provided between the output of a sense amplifier and a data bus or between memory block, which circuit is controlled in accordance with a write/read control signal of data so as to enable the bit line signal to be read at a high speed and the layout area of the IC to be reduced.

12 Claims, 10 Drawing Sheets

FIG. 5A  RDE
FIG. 5B  WDE
FIG. 5C  Φ1

FIG. 6

FIG. 7A ADD

FIG. 7B $\overline{RAS}$

FIG. 7C $\overline{CAS}$

FIG. 7F $\phi$00

FIG. 7G BS0

FIG. 7H $\phi$20

FIG. 7I BLi0 
FIG. 7J $\overline{BLi0}$

FIG. 7K Y 
FIG. 7L DB 
FIG. 7M $\overline{DB}$

DYNAMIC RANDOM ACCESS MEMORY

BACKGROUND OF THE INVENTION

1. Field of the Invention

The present invention relates to a semiconductor memory device, more particularly relates to a semiconductor memory device in which a transistor having a read gate construction is connected between a bit line and a data bus.

2. Description of the Related Art

Figure 1:
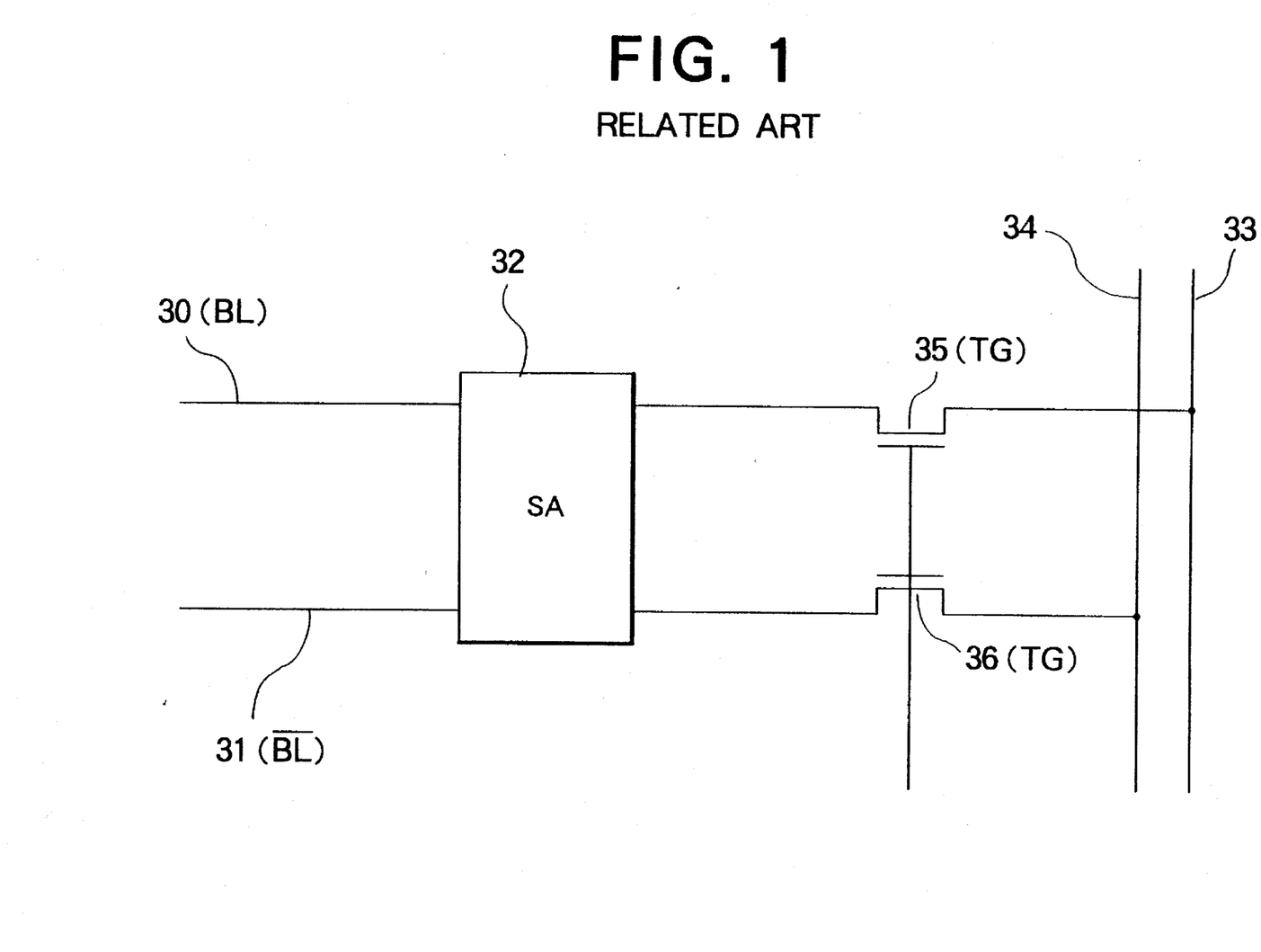
FIG. 1 is a circuit diagram of the configuration of a principal part of a semiconductor memory device of a first related art.

In the related art, a semiconductor memory device which stores data read and written as an electrical signal (voltage), for example, as shown in FIG. 1, has been comprised of a sense amplifier 32 which amplifies and outputs a voltage read from a memory cell (not illustrated) to a bit line 30 and an inverted bit line 31 at the time of a read operation, and supplies a write voltage via the bit line 30 and the inverted bit line 31 to the memory cell at the time of a write operation; read/write data buses 33 and 34 which output the read voltage at the time of a read operation, and receive as their inputs the write voltage at the time of a write operation; and transfer gates 35 and 36 which perform the switching of the above-described sense amplifier 32 and the read/write data buses 33 and 34.

In the semiconductor memory device shown in FIG. 1, the read operation of data is carried out by reading out the data stored in the memory cell to the bit line 30 and the inverted bit line 31 as the read voltage, amplifying this read voltage by the sense amplifier 32, and supplying this via the transfer gates 35 and 36 to the read/write data buses 33 and 34. The write operation of data is carried out by supplying the write voltage from the read/write data buses 33 and 34 via the transfer gates 35 and 36 to the sense amplifier 32 and supplying this write voltage via the bit line 30 and the inverted bit line 31 to the memory cell.

The above-mentioned semiconductor memory device shown in FIG. 1 has a problem, however, in that, since the capacitances of the read/write data buses 33 and 34 are added to the bit line 30 and the inverted bit line 31 and the capacitance of the memory cell is generally small, the read voltage is slow in rising and therefore a high speed operation is difficult.

Figure 2:
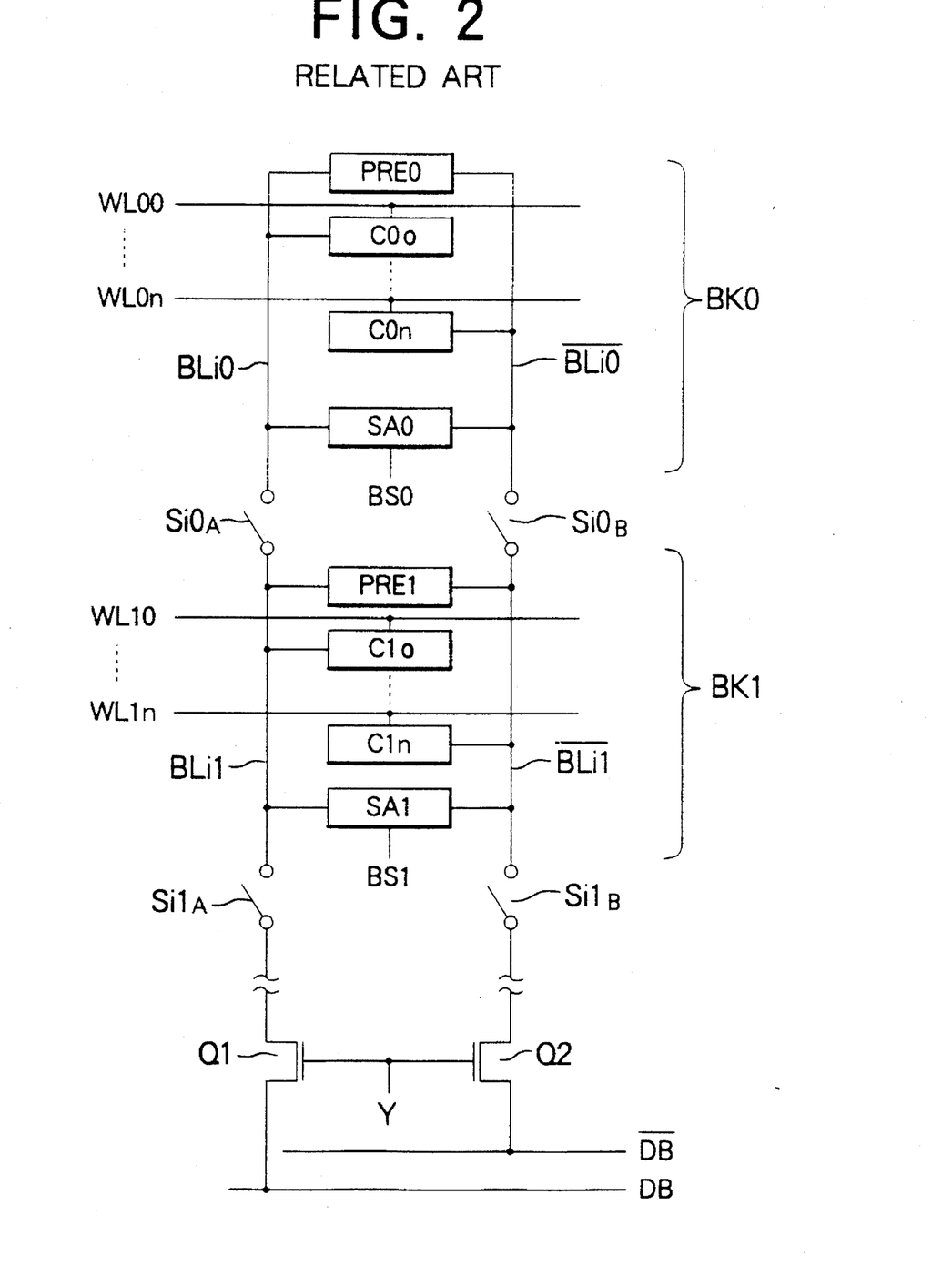
FIG. 2 is a view of an example of the configuration of a semiconductor memory device according to a second related art.

FIG. 2 is a view of an example of the configuration of a semiconductor memory device disclosed in Japanese Unexamined Patent Publication No. 61-123093 adopting this method. This device is an example in which the bit lines of each row are divided into a plurality of lines.

In the figure, BLi0, _BLi0, BLi1, _BLi1, . . . denote a plurality of divided bit line pairs of an i-th row comprising a bit line and an inverted bit line (_ indicates inversion); WL00 to WL0n, WL10 to WL1n, . . . denote word lines; C00 to C0n, C10 to C1n, . . . denote memory cells belonging to the same row; PRE0, PRE1, . . . denote precharge circuits; SA0, SA1, . . . denote sense amplifiers; BK0, BK1, . . . denote divided blocks (memory arrays); Si0$_A$:Si0$_B$, Si1$_A$:Si1$_B$, . . . denote switch circuits which serially connect the bit lines of the block or release the same; Q1 and Q2 denote transfer gates controlled by a column selection signal Y; and DB and _DB denote data buses.

The memory cells C00 to C0n are connected to the bit line pair BLi0 and _BLi0, and the memory cells C10 to C1n are connected to the bit line pair BLi1 and _BLi1. They are divided into blocks of BK0 and BL1.

The blocks BK0, BK1, . . . are provided with sense amplifiers SA0, SA1, . . . , respectively, which sense amplifiers SA0, SA1, . . . are activated by block selection signals BS0, BS1, . . .

Figure 3A:
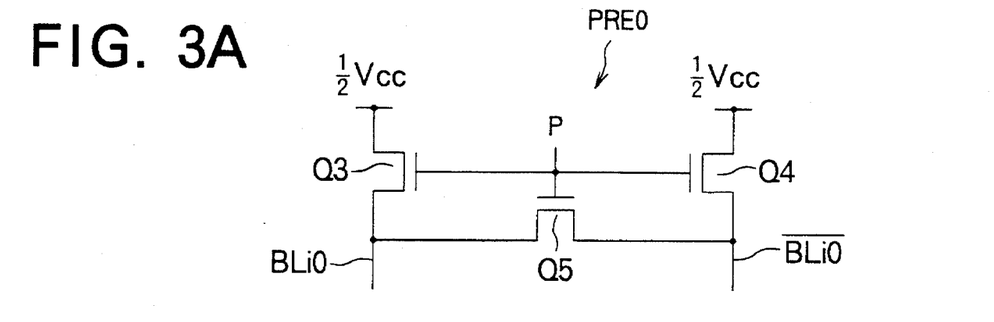
FIGS. 3A to 3E are views of concrete examples of the configuration of a principal part in FIG. 2.
Figure 3B:
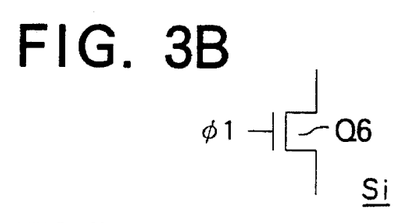
Figure 3C:
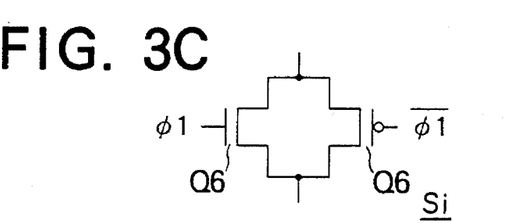
Figure 3D:
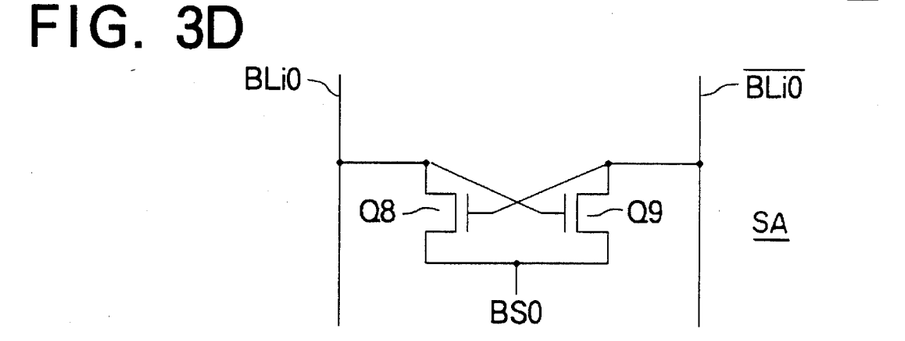
Figure 3E:
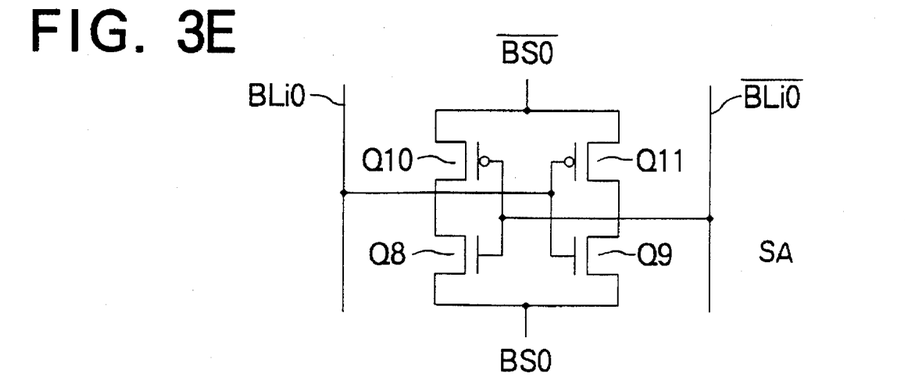

FIGS. 3A to 3E are views giving detailed examples of the configuration of different portions of the device, wherein FIG. 3A shows a bit line precharge circuit PRE; FIG. 3B and FIG. 3C show switch circuits Si for connecting the bit line; and FIG. 3D and FIG. 3E show examples of the configuration of the sense amplifier 3A.

The precharge circuit PRE0, as shown in FIG. 3A, is comprised of N-channel MOS transistors Q3 to Q5 with gates connected to the supply line of the precharge signal P. The sources of the precharge transistors Q3 and Q4 are connected to the supply line of the power source voltage ($\frac{1}{2}$)$V_{cc}$. An equalizing transistor Q5 is connected between the drains of the two transistors Q3 and Q4 connected to the bit line pair BLi0 and _BLi0.

The precharge circuit PRE0 of this configuration precharges the bit lines BLi0 and _BLi0 to the same potential ($\frac{1}{2}V_{cc}-V_{1b}$) when the precharge signal P is given. The same applies to the precharge circuits PRE1 . . . of other blocks.

The switch circuit Si shown in FIG. 3B comprises an N-channel MOS transistor Q6, while the switch circuit Si shown in FIG. 3C is constituted by connecting sources and drains of the transistor Q6 and a P-channel MOS transistor Q7 having an inverse conductivity to that of the transistor Q6.

The switch circuit Si shown in FIG. 3B is made conductive by inputting a clock signal $\phi 1$ to the gate of the transistor Q6.

The switch circuit Si shown in FIG. 3C simultaneously makes both of the transistors Q6 and Q7 conductive by supplying a clock signal $\phi 1$ and an inverse clock signal _$\phi 1$ thereof of complementary levels to the gates of the transistors Q6 and Q7.

The sense amplifier SA shown in FIG. 3D comprises N-channel MOS transistors Q8 and Q9 with sources connected to the supply line of the signal BS0. The gate of the transistor Q9 and the drain of the transistor Q8 are connected to the bit line BLi0, and the gate of the transistor Q8 and the drain of the transistor Q9 are connected to the inverted bit line _BLi0.

The sense amplifier SA shown in FIG. 3E has a so-called flip-flop structure of cross-connected CMOS inverters in which the drains of the P-channel MOS transistors Q10 and Q11 with sources connected to the supply line of the inverted signal _BS0 are connected to the drains of the transistors Q8 and Q9 of the sense amplifier SA shown in FIG. 3D, respectively.

Both of the sense amplifiers latch data of complementary levels of the bit line pair BLi0 and _BLi0 and amplify the same.

In a semiconductor memory device having such a configuration, one line among the word lines WL00 to WL0n of the block BK0 is selected. When the i-th row of cells belonging to this word line is selected, only the sense amplifier SA0 is activated by the block selection signal BS0.

As a result, the differential voltage between the bit lines BLi0 and _BLi0 is enlarged at the sense amplifier SA0, and all switch circuits Si0$_A$:Si0$_B$, Si1$_A$:Si1$_B$, . . . are held in the conductive state.

Due to this, the bit lines BLi0, _BLi0, BLi1 and _BLi1 are connected in series. Also, the column selection signal Y is supplied to the gates of the transistors Q1 and Q2 at a high level and the gates Q1 and Q2 are controlled to the conductive state, the bit line pair is connected to the data buses DB and _DB, and the data is read onto the data buses DB and _DB.

The advantage of the bit line division mentioned above is that the load capacitance of each sense amplifier at the time of a sense operation is small, that is, a load capacitance of only one set of the divided bit line pair is sufficient.

However, in the above-mentioned semiconductor memory device, when the switch circuits $Si0_A$:$Si0_B$, $Si1_A$:$Si1_B$, . . . are made conductive to connect the bit line pairs, the load capacitance of the sense amplifier is increased to the value before the division of the bit lines. For this reason, the once amplified voltage on the bit line pair is reduced and the driving ability of the sense amplifier is impaired. In the end, the time until a required differential voltage is produced on the data buses DB and _DB is not shortened much at all.

SUMMARY OF THE INVENTION

An object of the present invention is to provide a semiconductor memory device which can perform a read and a write operation at a high speed and can be reduced in the layout area.

Another object of the present invention is to provide a semiconductor memory device which can increase the speed of the sense operation, and can reduce the charge and discharge current of the bit lines and thereby can reduce the power consumption.

So as to achieve the above-mentioned first object, there is provided a semiconductor memory device in which a transistor having a read gate construction is connected between a bit line and a data bus, characterized in that provision is made of a control transistor which is provided between the source or drain of the transistor having the read gate construction and a ground and is turned off at the time of a write operation of data; a read transistor which is provided between the transistor having the read gate construction and the data bus and is turned on by a read request signal at the time of a read operation and at the time of a write operation; and a write transistor which is provided at a stage in front of the transistor having the read gate construction, is turned on by a write request signal, and performs switching between the bit line and the read transistor.

In this aspect of a semiconductor memory device according to the present invention, when a read request signal is supplied to the read transistor, the read transistor is turned on. Also, the control transistor becomes on when the transistor having the read gate construction is turned on in accordance with the voltage of the bit line, the data bus is connected via the read transistor and the control transistor to the ground potential, so that the read current flows. The voltage of the data bus is changed by this read current whereby the data is read out.

On the other hand, at the time of a write operation of the data, when the write request signal is supplied to the write transistor, the write transistor is turned on. Also, the read transistor is turned on by the read request signal. Then, when a write voltage is input from the data bus, this write voltage is supplied via the read transistor and the write transistor to the bit line. At this time, the control transistor has been turned off, and therefore no current flows into the transistor having the read gate construction by the write voltage from the data bus, and the write voltage can be supplied to the bit line at a high speed.

Also, there is provided a semiconductor memory device characterized in that provision is made of control transistors which are provided between the sources or drains of transistors having a read gate construction, each of which being connected between bit lines and inverted bit lines and data buses, and the ground and are turned off at the time of a write operation of data; read transistors which are provided between the transistors having the read gate construction and the data buses and are turned on by a read request signal at the time of a read operation and at the time of a write operation; and write transistors which are provided at a stage at the front of the transistors having the read gate construction, are turned on by a write request signal, and perform switching between the bit lines and the inverted bit lines and the read transistors.

In this aspect of the semiconductor memory device according to the present invention, at the time of a read operation of data, when the read request signal is supplied to the read transistors, the read transistors are turned on. Also, the control transistors are turned on. Then, when the transistors having the read gate construction are turned on in accordance with the voltage of the bit lines and the inverted bit lines, the data buses are connected via the read transistors and the control transistors to the ground potential and the read current flows. The voltages of the data buses are changed by this read current, whereby the data is read out.

On the other hand, at the time of a write operation of data, when a write request signal is supplied to the write transistors, the write transistors are turned on. Also, the read transistors are turned on by the read request signal. When the write voltage is input from the data buses, this write voltage is supplied via the read transistors and the write transistors to the bit lines and inverted bit lines. At this time, the control transistors have been turned off, and therefore no current flows into the transistors having the read gate construction by the write voltage from the data buses, and the write voltage can be supplied to the bit lines at a high speed.

Further, so as to realize the second object of the present invention, there is provided a semiconductor memory device provided with bit lines divided and connected to a plurality of memory arrays in block, sense amplifiers provided for each of the memory arrays, switch means for connecting together bit lines belonging to adjoining memory arrays, and gate means connected to the bit lines in parallel to the switch means.

Preferably, in the semiconductor memory device of the present invention, each two adjoining memory arrays share sense amplifiers.

More preferably, the gate means are activated in sequence from the side furthest from the output port.

Still more preferably, each of the sense amplifiers has two terminals for supply of an operation voltage and a fixed voltage is applied across these two terminals.

Still more preferably, the semiconductor memory device of the present invention is made able to set the potentials of the bit lines to a first potential, then selectively discharge the potentials to a second potential by providing each bit line with a transistor between the bit line and the second potential. The gate terminal of this transistor is controlled by the output of the sense amplifier.

According to the semiconductor memory device of the present invention, the data is subjected to amplification action and transferred to the bit line of the next stage, for example, not via the switch means for connecting the bit lines, but by gate means provided in parallel to the switch means.

In this case, the switch means for connecting the bit lines is once opened after the sense operation and simultaneously the gate means is activated, so the bit line signal is read at a high speed without degradation of the driving ability of the sense amplifier.

Also, the sense operation is carried out until the potential of the selected bit line reaches a potential necessary for performing the rewrite of the memory cell and then the gate means is activated.

Further, the switch means for connecting the bit lines is opened before the potential of the bit line completely reaches the predetermined voltage and, at the same time, the gate means is activated, so the speed of the read operation is further increased.

In the latter case, it is necessary to open the column selection gate after reading the signal onto the data bus, close the switch between the bit line belonging to the selected block and the sense amplifier, and give a voltage necessary for the rewrite from the sense amplifier to the bit line.

BRIEF DESCRIPTION OF THE DRAWINGS

These and other objects and features of the present invention will become clearer from the following description of the preferred embodiments made with reference to the following drawings, in which.

DESCRIPTION OF THE PREFERRED EMBODIMENTS

Below, preferred embodiments of the semiconductor memory device according to the present invention will be explained in detail referring to the figures. This embodiment relates to a dynamic random access memory (DRAM) wherein the memory cell for storing data is comprised by a capacitance element.

Figure 4:
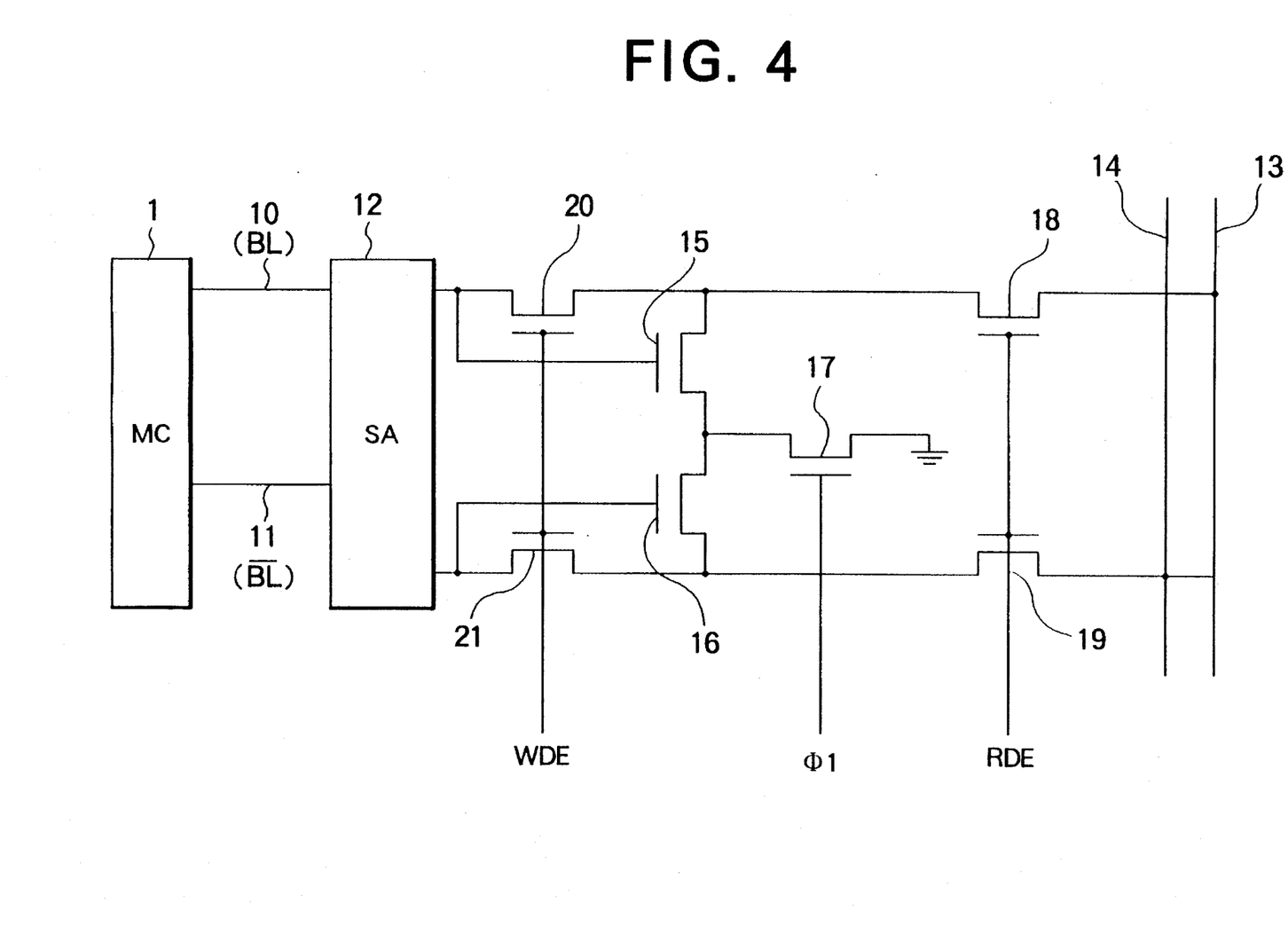
FIG. 4 is a circuit diagram of the configuration of a principal part of a semiconductor memory device according to a first embodiment of the present invention.

The semiconductor memory device provides, as shown in FIG. 4, a memory cell array 1 consisting of a plurality of memory cells for storing the data; a bit line (BL) 10 and an inverted bit line (_BL) 11 which output the voltage read from this memory cell array 1 and supply a write voltage to the memory cell array 1; a sense amplifier 12 which amplifies the voltage read to the bit line 10 and inverted bit line 11 and outputs the same and supplies an input write voltage via the bit line 10 and the inverted bit line 11 to the memory cell array 1; read/write data buses 13 and 14 which output the read voltage and receive as their inputs the write voltage; read gates (transistors having a read gate construction) 15 and 16 which perform switching by the voltage of the bit line 10 and the inverted bit line 11 amplified by the sense amplifier 12; a control transistor 17 which is provided between drains of these read gates 15 and 16 and a ground and is turned off at the time of the write operation of the data; read transistors 18 and 19 which are provided between the read gates 15 and 16 and the data buses 13 and 14 and are turned on by a read request signal at the time of a read operation and at the time of a write operation; and write transistors 20 and 21 which are provided at a stage in front of the read gates 15 and 16, are turned on by a write request signal, and supply the write voltage input from the data buses 13 and 14 to the sense amplifier 12.

Figures 5A, 5B:
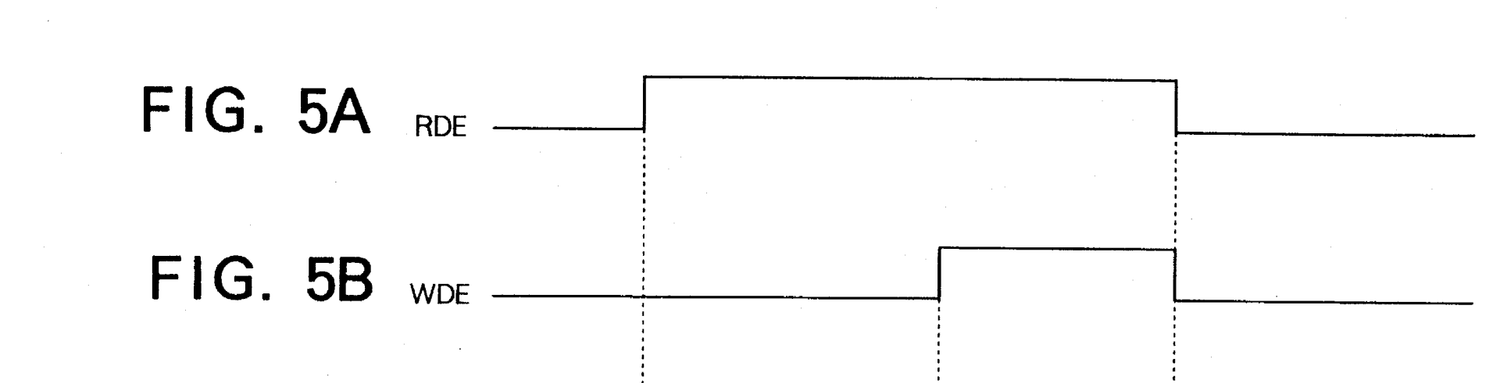
FIGS. 5A to 5C are views for explaining the operation of the semiconductor memory device shown in FIG. 4.
Figure 5C:
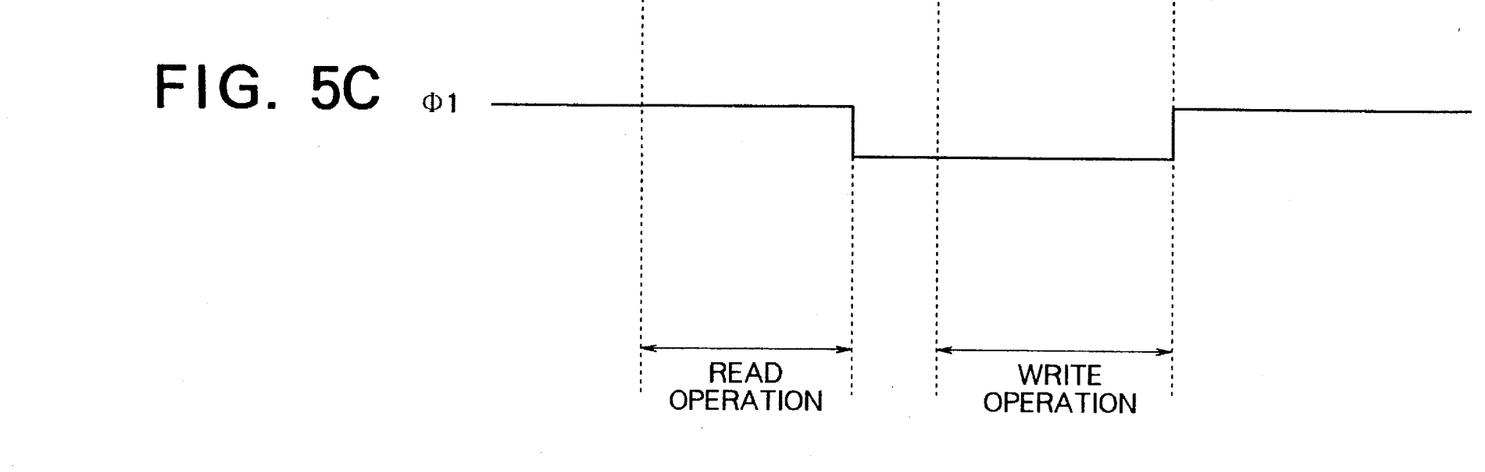

At the time of the read operation of the data, as shown in FIGS. 5A to 5C, a control signal $\phi_1$ supplied to the gate of the control transistor 17 becomes a high level, the control transistor 17 becomes on, and the drains of the read gates 15 and 16 are grounded via the control transistor 17. Also, when the read request signal RDE supplied to the gates of the read transistors 18 and 19 becomes a high level, the read transistors 18 and 19 are turned on.

The memory cell array 1 supplies a read voltage in accordance with the stored data to the bit line 10 and the inverted bit line 11. One of the voltages supplied to the bit line 10 and inverted bit line 11 becomes a high level and the other of them becomes a low level in accordance with the data stored in the memory cell array 1. For example, when "1" is stored in the memory cell of the memory cell array 1, the voltage of the bit line 10 becomes a high level and the voltage of the inverted bit line 11 becomes a low level. Also, when for example "0" is stored in the memory cell of the memory cell array 1, the voltage of the bit line 10 becomes a low level and the voltage of the inverted bit line 11 becomes a high level.

The sense amplifier 12 amplifies the voltage between the bit line 10 and the inverted bit line 11 and supplies the same to the gates of the read gates 15 and 16.

The read gates 15 and 16 perform a switching operation in accordance with the voltage supplied from the sense amplifier 12. For example, when a voltage of a high level is supplied from the sense amplifier 12 to the gate of the read gate 15, the read gate 15 becomes on. When a voltage of a low level is supplied to the gate of the read gate 16, the read gate 16 becomes off.

Here, when the read gate 15 becomes on, the read current flows from the data bus 13 via the read transistor 18, the read gate 15, and the control transistor 17. Also, when the read gate 16 becomes on, the read current flows from the data bus 14 via the read transistor 19, the read gate 16, and the control transistor 17. The voltage of the data buses 13 and 14 fluctuates by this read current, whereby the data is read.

More specifically, when the voltages supplied to, for example, the read gates 15 and 16 are a high level and a low level, respectively, the read gate 15 becomes on and the read gate 16 becomes off, and the current flows from the data bus 13 via the read transistor 18, the read gate 15, and the control transistor 17. Then, the voltage of the data bus 13 is lowered due to resistance etc. of the data bus 13, and the voltage of the data bus 13 becomes a low level relative to the voltage of the data bus 14.

Also, when the voltages supplied to, for example, the read gates 15 and 16 are a low level and a high level, respectively, the read gate 15 becomes off, the read gate 16 becomes on, and the current flows from the data bus 14 via the read transistor 19, the read gate 16, and the control transistor 17. Then, the voltage of the data bus 14 is lowered and the voltage of the data bus 13 becomes a high level relative to the voltage of the data bus Thus, the read voltage corresponding to the data stored in the memory cell array 1 is output to the data buses 13 and 14.

At the time of a write operation of data, as shown in the above-mentioned FIG. 5C, a control signal $\phi_1$ supplied to the control transistor 17 becomes a low level, and the control transistor 17 becomes off. Namely, the state is exhibited where the drains of the read gates 15 and 16 have not been grounded. Also, the read request signal RDE supplied to the gates of the read transistors 18 and 19 becomes a high level, and the read transistors 18 and 19 become on. Also, the write request signal WDE supplied to the gates of the write transistors 20 and 21 becomes a high level and the write transistors 20 and 21 become on.

Then, when the write voltage is supplied to the data buses 13 and 14, the sense amplifier 12 receives as its input the write voltage via the read transistors 18 and 19 and the write transistors 20 and 21 and supplies the same to the bit line 10 and the inverted bit line 11 to perform the writing of the data to the memory cell array 1. For example, when a write voltage of the low level is supplied to the data bus 13 and a write voltage of the high level is supplied to the data bus 14, the sense amplifier 12 supplies a voltage of the high level to the bit line 10 and a voltage of the low level to the inverted bit line 11, so that "0" is stored in the memory cell of the memory cell array 1.

At this time, the control transistor 17 has become off, and therefore current does not flow into the sources of the read gates 15 and 16 by the write voltage from the data buses 13 and 14.

As clear from the above explanation, this semiconductor memory device has a configuration in which, by turning off the control transistor 17 at the time of the write operation of data, current does not flow into the read gates 15 and 16 from the data buses 13 and 14, and in which the data bus is commonly used at the time of the read and write operation and therefore the layout area can be reduced compared with a semiconductor memory data of the related art provided with both a read data bus and a write data bus. Also, by disposing the write transistors 20 and 21 and the read transistors 18 and 19 in series with respect to the data buses 13 and 14, a gate overlap capacitance and a junction capacitance of the write transistors 20 and 21 are not added to the data buses 13 and 14, and thus the capacitance added to the data buses 13 and 14 can be reduced compared with the semiconductor memory device of the related art in which the write transistors and the read transistors are provided in parallel to the data buses and therefore an increase of speed of the read and write operations becomes possible.

Note that, the present invention is not limited to the above-mentioned embodiments. It is also possible to adopt a configuration in which, for example, the inverted bit line 11 is not provided, but only the bit line 10 is provided, and the read gate, control transistor, read transistor, and write transistor are provided. In this case, the read and write operations of the data are carried out based on the difference between the ground potential and the potential of the data bus. Also, the present invention is not limited to a DRAM. It can be naturally applied to an SRAM, flash memory, or the like storing data as an electrical signal.

As apparent from the above-mentioned description, in the present invention, by providing a semiconductor memory device wherein a transistor having a read gate construction is connected between the bit line and the data bus, the source or drain of the transistor having the read gate construction is connected to the ground potential via the control transistor which is turned off at the time of a write operation of data and a write transistor which is turned on by the write request signal is provided at a stage in front of the transistor having the read gate construction, a read transistor which is turned on by the read request signal at the time of the read operation and at the time of the write operation is provided between the transistor having the read gate construction and the data bus, a gate overlap capacitance and a junction capacitance of the write transistor are not added to the data bus, the read and write operations can be carried out at a high speed, and the data bus is commonly used at the time of the read operation and the write operation and therefore the layout area can be reduced in comparison with the related art.

Also, in the present invention, in a semiconductor memory device wherein the transistor having the read gate construction is connected between the bit line and inverted bit line and the data bus, by providing a control transistor between the sources or drains of the transistors having the read gate construction respectively connected between the bit line and inverted bit line, and the data buses, and the ground, and turned off at the time of the write operation of the data; read transistors which are provided between the respective transistors having the read gate construction and the data buses and turned on by the read request signal at the time of the read operation and at the time of the write operation; and write transistors, which are provided at a stage in front of the respective transistors having the read gate construction, are turned on by the write request signal and perform the switching between the bit line and inverted bit line, and the read transistors, the gate overlap capacitance and junction capacitance of the write transistor are not added to the data bus, the read and write operation can be carried out at a high speed, and the data bus used at the time of the read operation and the write operation is commonly used, and therefore a layout area is reduced.

Figure 6:
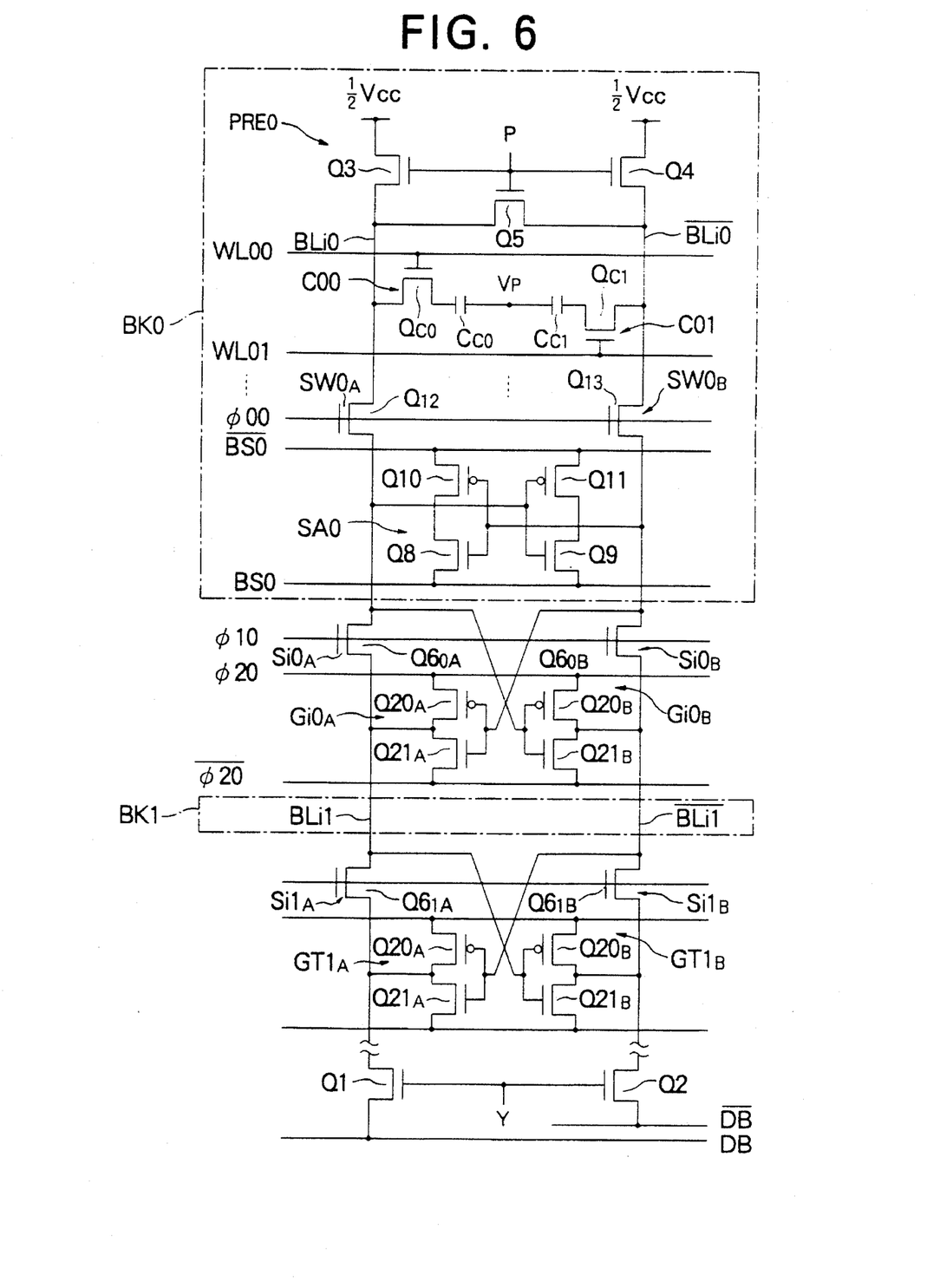
FIG. 6 is a circuit diagram of a semiconductor memory device according to a second embodiment of the present invention.

FIG. 6 is a circuit diagram of a second embodiment of the semiconductor memory device according to the present invention, in which the same constituent elements as those of FIG. 2 showing the related art are expressed by the same references.

Namely, BLi0, _BLi0, BLi1, _BLi1, . . . denote bit line pairs of an i-th row; WL00 to WL01, . . . denote word lines; C00, C01, . . . denote memory cells belonging to the same row; PRE0, . . . denote precharge circuits; SA0, . . . denote sense amplifiers; SW0$_A$:SW0$_B$ . . . are switch circuits for operationally connecting the memory cells C0, C01, . . . and the sense amplifiers SA0, . . . ; BK0, BK1, . . . denote divided blocks (memory arrays); Si0$_A$:Si0$_B$, Si1$_A$:Si1$_B$, . . . Si0, denote switch circuits which serially connect the bit lines of the block or release the same; Q1 and Q2 denote transfer gates controlled by the column selection signal Y; and DB and _DB denote data buses; respectively.

The precharge circuit PRE0 comprises N-channel MOS transistors Q3 to Q5 with gates connected to the supply line of the precharge signal P. The sources of the precharge transistors Q3 and Q4 are connected to the supply line of the power source voltage ($\frac{1}{2}V_{cc}$), and an equalizing transistor Q5 is connected between drains of the transistors Q3 and Q4 connected to the bit line pair BLi0 and _BLi0.

The precharge circuit PRE0 precharges the bit lines BLi0 and _BLi0 to the same potential ($\frac{1}{2}V_{cc} - V_{th}$) when the precharge signal P is given. The precharge circuits PRE1, . . . of the other blocks, not illustrated, have a similar configuration and function.

The memory cell C00 is constituted by an N-channel MOS transistor $Q_{c0}$ and a capacitor $C_{c0}$ connected in series between the bit line BLi0 and a reference potential (for example a ground line) $V_p$. The gate of the transistor $Q_{c0}$ is connected to the word line WL00.

Similarly, the memory cell C01 is constituted by an N-channel MOS transistor $Q_{c1}$ and a capacitor $C_{c1}$ connected in series between the bit line _BLi0 and a reference potential $V_p$. The gate of the transistor $Q_{c1}$ is connected to the word line WL01. The other memory cells, not illustrated, have a similar configuration.

The switch circuits $SW0_A$ and $SW0_B$ are constituted by N-channel MOS transistors Q12 and Q13 which are inserted in the bit lines BLi0 and _BLi0, respectively, and connected thereto. The gates of the transistors Q12 and Q13 are connected to the supply line of the signal $\phi00$.

The sense amplifier SA0 is constituted by cross-connecting in a flip-flop configuration between the bit lines BLi0 and _BLi0 and between the supply line of the signal BS0 and the supply line of the inverse signal _BS0 thereof an inverter comprising an N-channel MOS transistor Q8 and a P-channel MOS transistor Q10 with drains and gates connected to each other and an inverter comprising an N-channel MOS transistor Q9 and a P-channel MOS transistor Q11. The sense amplifier SA latches the data, taking a complementary level, of the pair of bit lines BLi0 and _BLi0 and amplifies the same. Also, not illustrated sense amplifiers of the other blocks BK1, . . . have a similar structure.

The switch circuits $Si0_A:Si0_B$, $Si1_A:Si1_B$, . . . are constituted by N-channel MOS transistors $Q6_{0A}:Q6_{0B}$, $Q6_{1A}:Q6_{1B}$, . . . inserted in the pairs of bit lines between the respective blocks and connected thereto, the gates of the transistors $Q6_{0A}$ and $Q6_{0B}$ are connected to the supply line of the signal $\phi10$, and the gates of the transistors $Q6_{1A}$ and $Q6_{1B}$ are connected to the supply line of the signal $\phi11$.

The bit lines of the blocks are connected in series or released in accordance with the input level of the signals $\phi10$, $\phi11$, . . .

The gate circuits $GT0_A$ and $GT0_B$ are connected in parallel to the switch circuits $Si0_A$ and $Si0_B$ with respect to the bit line pair.

The gate circuit GT0 is constituted by a CMOS inverter comprising a P-channel MOS transistor Q20 and an N-channel MOS transistor $Q21_A$, the drains and gates of which are connected to each other, between the supply lines of the signal $\phi20$ (for example the power source voltage $V_{cc}$ level) and $\_\phi20$ (for example the ground level) taking complementary levels.

Then, the connection points of the gates of the transistors $Q20_A$ and $Q21_A$ which become the inputs of the gate circuit $GT0_A$ are connected to the bit line _BLi0 between the block BK0 and the switch circuit $Si0_B$, and the connection points of the drains of the transistors $Q20_A$ and $Q21_A$ which become the outputs of the gate circuit $GT0_A$ are connected to the bit line BLi1 between the switch circuit SiO and the block BK1.

The gate circuit $GT0_B$ is constituted by a CMOS inverter comprising a P-channel MOS transistor $Q20_B$ and an N-channel MOS transistor $Q21_B$, the drains and gates of which are connected to each other, between the supply lines of the signal $\phi20$ (for example the power source voltage $V_{cc}$ level) and $\_\phi20$ (for example the ground level) taking complementary levels.

Then, the connection points of the gates of the transistors $Q20_B$ and $Q21_B$ which become the inputs of the gate circuit $GT0_B$ are connected to the bit line BLi0 between the block BK0 and the switch circuit Si0, and the connection points of the drains of the transistors $Q20_B$ and $Q21_B$ which become the outputs of the gate circuit $GT0_B$ are connected to the bit line $BLi1_B$ between the switch circuit $Si0_B$ and the block BK1.

Accordingly, when it is assumed that the level of the bit line BLi0 is the $V_{cc}$ level and the level of the bit line _BLi0 is the ground level when for example the switch circuits $Si0_A$ and $Si0_B$ are nonconductive in state, the level of the bit line BLi1 of the next memory array becomes the level of the signal $\phi20$, that is, the $V_{cc}$ level, since the signal of the ground level of the bit line _BLi0 is input to the input of the inverter gate circuit GT0.

Also, the level of the bit line _BLi1 of the next memory array becomes the level of the signal $\_\phi20$, that is, the ground level, since the signal of the $V_{cc}$ level of the bit line BLi0 is input to the input of the inverter gate circuit $GT0_B$.

In this way, due to the existence of the gate circuits $GT0_A$ and $GT0_B$ connected in parallel to the switch circuits $Si0_A$ and $Si0_B$, even if the switch circuits $Si0_A$ and $Si0_B$ are nonconductive in state, the data of the pair of bit lines BLi0 and _BLi0 can be transferred to the next pair of bit lines BLi1 and _BLi1.

Note that the gate circuits $GT1_A:GT1_B$, . . . having the same configuration and function as the above-mentioned gate circuits $GT0_A$ and $GT0_B$ are connected in parallel to the other switch circuits $Si1_A:Si1_B$, . . .

Next, the operation by the above-described configuration will be explained referring to the timing charts of FIG. 7A to FIG. 7M. Note that, it is assumed that the pair of bit lines BLi0 and _BLi0 is precharged.

First, in an initial state, both of the signals _RAS and _CAS have become the high level. At this time, the precharge signal P is at the high level and the pair of bit lines BLi0 and _BLi0 have been preset to the high level, such as $\frac{1}{2}V_{cc}$.

Next, a row address is latched by an address bus by a trailing edge of the signal _RAS from the high level to the low level. For example, the level of the selected word line WL00 is raised from the low level to the high level. Note that, at this time, the precharge signal P is switched from the high level to the low level.

Figure 7A:
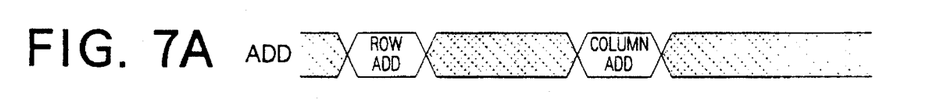
FIGS. 7A to 7M are timing charts explaining the operation of the semiconductor memory device of FIG. 6.
Figure 7B:
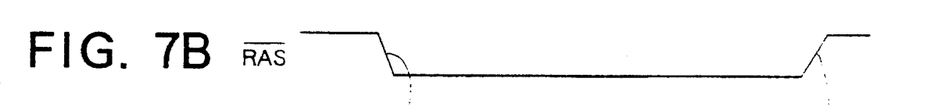
Figure 7C:
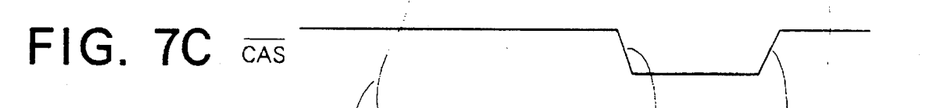
Figure 7D:
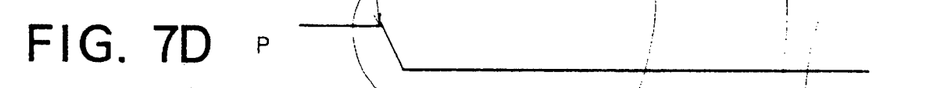
Figure 7E:
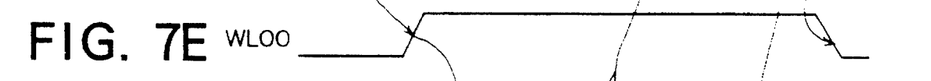

Along with the switching of the level of the selected word line WL00 to the high level, the transistor $Q_{c0}$ of the memory cell C00 becomes conductive in state, and the charges stored in the capacitor $C_{c0}$ are read to the bit line BLi0.

Figure 7F:
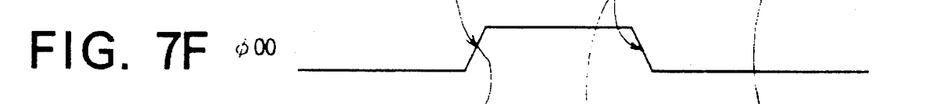
Figure 7G:
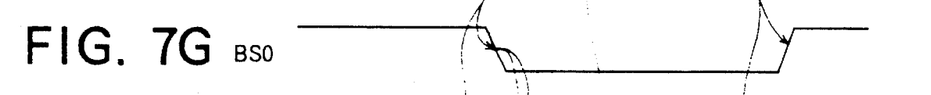
Figure 7H:
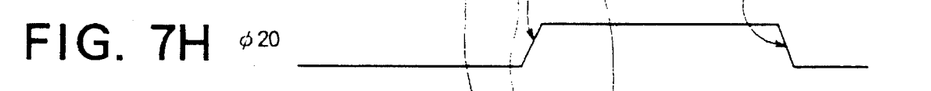
Figures 7I, 7J:
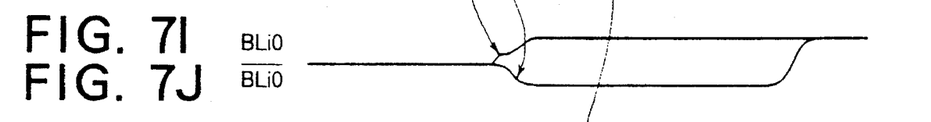
Figures 7K, 7L, 7M:
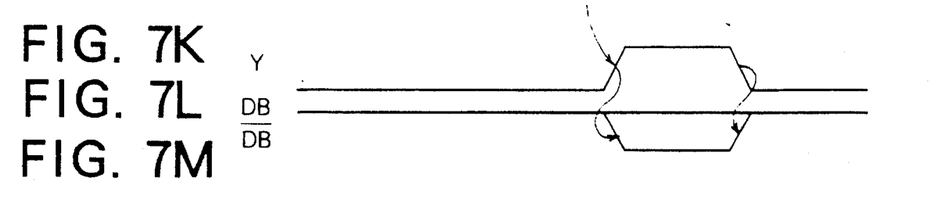

In this case, while the potential of the bit line _BLi0 constituting the bit line pair together with the bit line BLi0 is the precharge voltage ($\frac{1}{2}V_{cc}$), an initial voltage higher or lower than the precharge voltage by exactly $\Delta V$ is given to the bit line BLi0 by information stored in the memory cell C00.

Subsequently, the signal $\phi00$ is raised from the low level to the high level, and the switch circuits $SW0_A$ and $SW0_B$ are held in the conductive state.

Then, a signal BS0 for energizing the sense amplifier SA0 is lowered from the high level to the low level and conversely the signal _BS0 is raised from the low level to the high level. By this, the potential difference between the pair of bit lines BLi0 and _BLi0 is amplified by the sense amplifier SA0. As a result, the potential of the bit line pair is held at the power source voltage $V_{cc}$ level for the bit line BLi0 and at the ground level for the bit line _BLi0.

Thereafter, the signal φ20 is raised to the high level and the signal _φ20 is set at the low level. At this time, the signal φ10 is held at the low level as it is, and the switch circuits $Si0_A$ and $Si0_B$ are held in the nonconductive state.

By the setting of the signal φ20 to the high level and the signal _φ20 to the low level, as mentioned above, if the level of the bit line BLi0 is at the $V_{cc}$ level and the level of the bit line _BLi0 is at the ground level, even if the switch circuits $Si0_A$ and $Si0_B$ are in the nonconductive state, the level of the bit line BLi1 of the next memory array becomes the level of the signal φ20, that is, the $V_{cc}$ level, since the signal of the ground level of the bit line _BLi0 is input to the input of the inverter gate circuit $GT0_A$. Also, the level of the bit line _BLi1 of the next memory array becomes the level of the signal _φ20, that is, the ground level, since the signal of the $V_{cc}$ level of the bit line BLi0 is input to the input of the inverter gate circuit $GT0_B$.

In this way, the potential of the bit line pair is sequentially transferred via the gate circuits $GT0_A$:$GT0_B$, $GT1A_A$:$GT1_B$, ... to the bit line of the input/output port side.

Thereafter, the signal _CAS is lowered from the high level to the low level, whereby the row address is latched and then the signals φ00, ... is lowered from the high level to the low level, the column selection signal Y is selectively raised from the low level to the high level, and the information read from the memory is transferred to the data buses DB and _DB.

As explained above, according to the present embodiment, gate circuits $GT0_A$:$GT0_B$, ... which amplify the signal in a direction from the bit line to the input/output gate are provided in parallel to the switch circuits $Si0_A$:$Si0_B$, ... for connecting the bit lines, the switch circuits $Si0_A$:$Si0_B$, ... for connecting the bit lines are once opened after the sense operation, and simultaneously the gate circuits $GT0_A$:$GT0_B$, ... are activated, and therefore the bit line signal can be read at a high speed without degradation of the driving ability of the sense amplifier.

Note that, even if it is constituted so that the sense operation is carried out until the potential of the selected bit line reaches a potential necessary for performing the rewrite in the memory cell and then the bit line signal amplification gate circuits $GT0_A$:$GT0_B$, ... are activated, effects similar to the above-mentioned effects can be obtained.

Also, before the potential of the bit line completely reaches the predetermined voltage, the switch circuits $Si0_A$:$Si0_B$, ... for connecting the bit lines are opened and, at the same time, the gate circuits $GT0_A$:$GT0_B$, ... are activated, whereby it is also possible to further increase the read operation speed.

But in the latter case, it is necessary to open the row selection gate after reading the signal out to the data buses DB and _DB, close the switch circuit between the bit line belonging to the selected block and the sense amplifier, and give a voltage necessary for the rewrite from the sense amplifier to the bit line.

Also, in the present embodiment, an explanation was made of a case where a sense amplifier was provided for each of the blocks (memory arrays), but needless to say the present invention can be applied to a so-called shared-sense amplifier system in which for example each two adjoining memory arrays share one sense amplifier.

Figure 8:
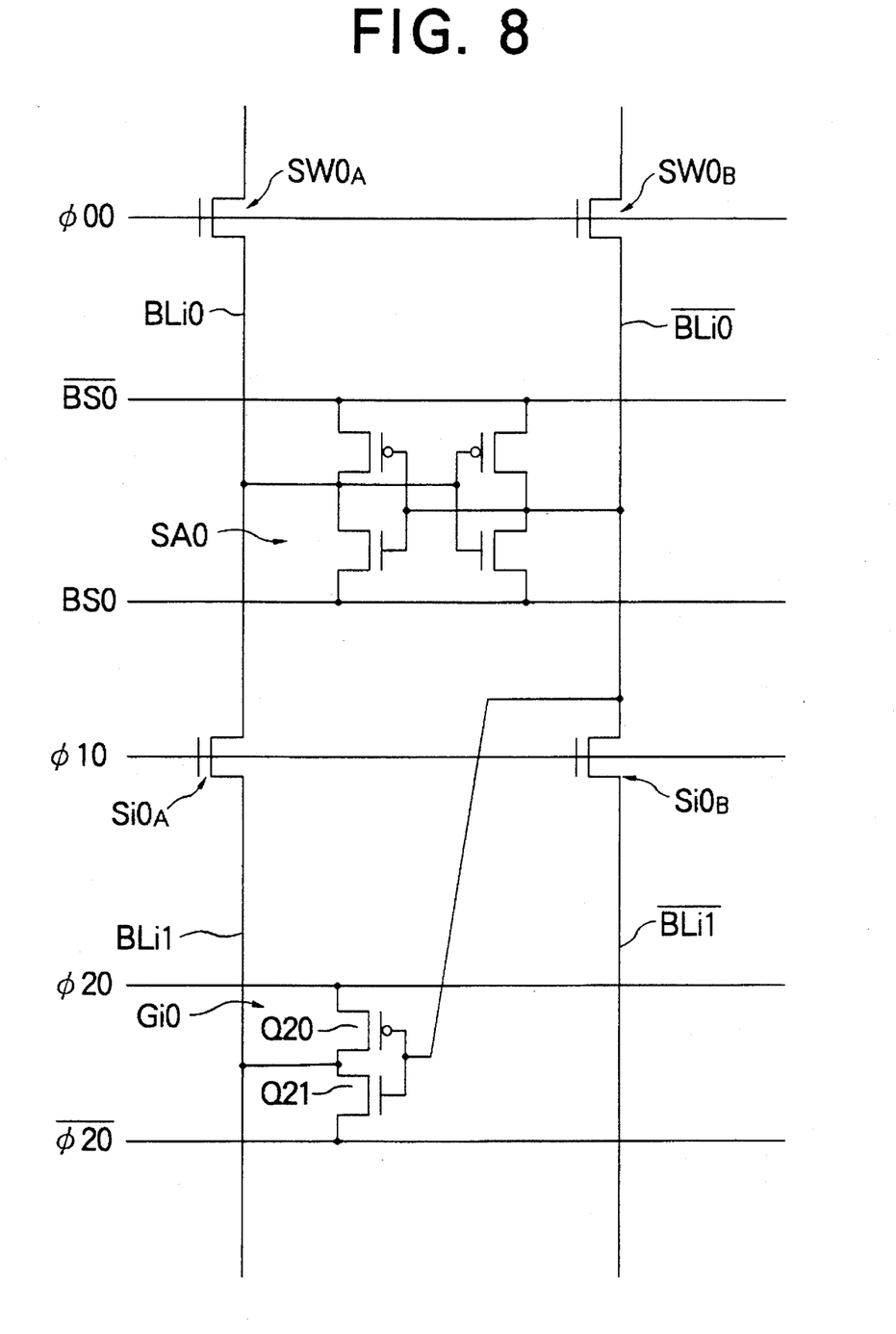
FIG. 8 is a circuit diagram of the configuration of a principal part of a semiconductor memory device according to a third embodiment of the present invention.

FIG. 8 is a circuit diagram of the configuration of a principal part of a third embodiment of the semiconductor memory device according to the present invention.

The point of difference of the present embodiment from the above-mentioned first embodiment resides in that the inverter used as the gate circuit is provided in only one line of the bit line pair.

In this case, the information from the block BK0 to the block BK1 is transferred from the bit line _BLi0 to the bit line BLi1.

In the connection of the buffer from the bit line BLi1 to the output port, the connection of the inverters must be alternately inverted.

In this case, it is preferred if the data buses DB and $\overline{DB}$ are preset to an intermediate value of the positive/negative power supply voltages and the data buses DB and $\overline{DB}$ are sense-amplified with a slight time lag from the rising edge of the column selection signal Y selectively activating the transfer gates Q1 and Q2, that is, by a signal obtained by delaying, for example, the CAS signal.

By adopting such a configuration, there is an advantage in that, in addition to the effect of the embodiments mentioned above, the discharge current of the bit line used for passing therethorough can be reduced to a half.

Figure 9:
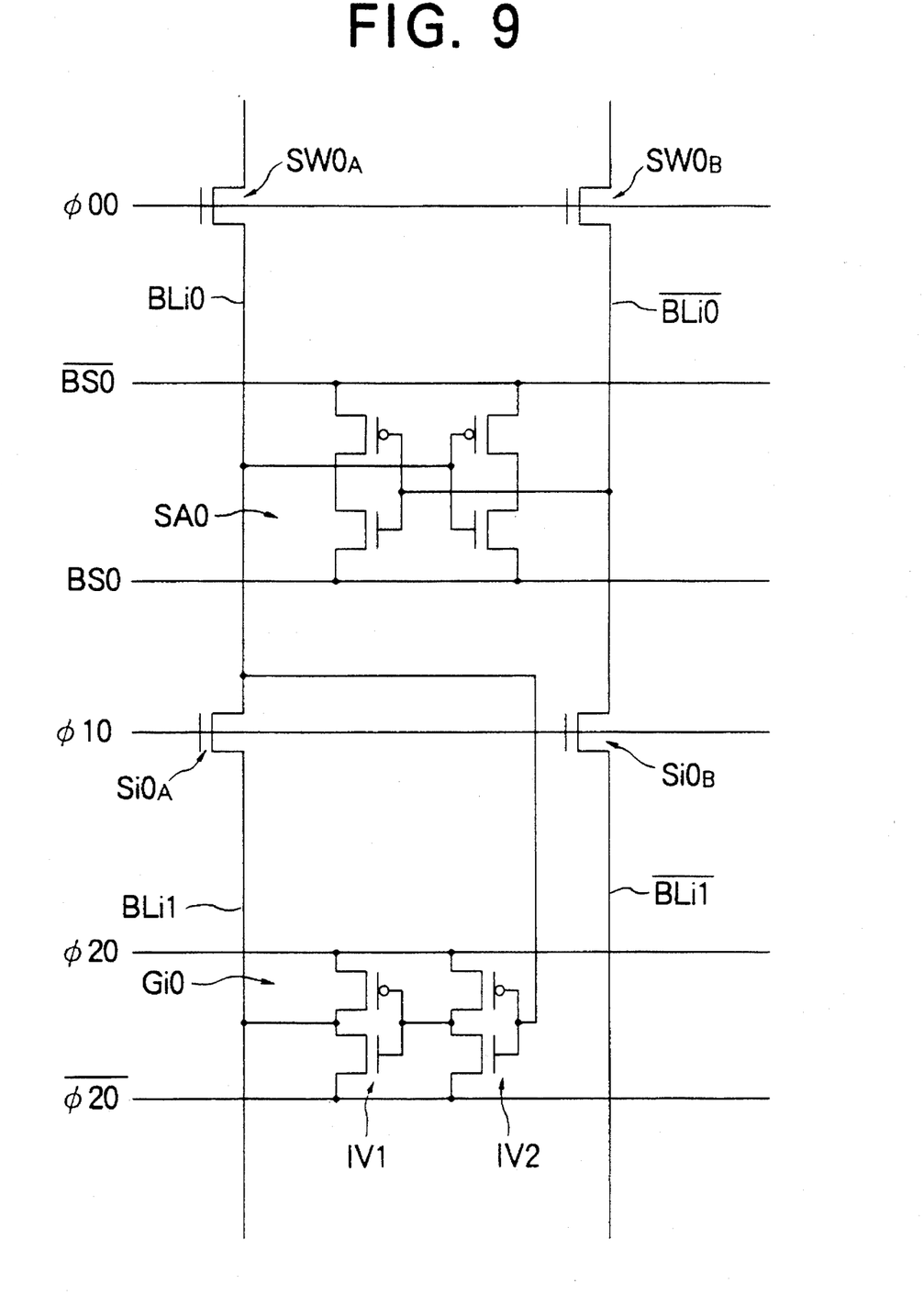
FIG. 9 is a circuit diagram of the configuration of a principal part of a semiconductor memory device according to a fourth embodiment of the present invention.

FIG. 9 is a circuit diagram of the configuration of a principal part of a fourth embodiment of the semiconductor memory device according to the present invention.

The point of difference of the present embodiment from the above-mentioned second embodiment is that the gate circuit Gi0 is not constituted by a single inverter but is constituted by two cascade-connected inverters IV1 and IV2. Also, the input of the gate circuit Gi0 whose output is connected to the bit line BLi1 is not connected to the bit line _BLi0, but connected to the bit line BLi0.

According to the present embodiment, it is not necessary to perform sense-amplification on the data line and therefore it is possible reduce the discharge current of the bit line.

Figure 10:
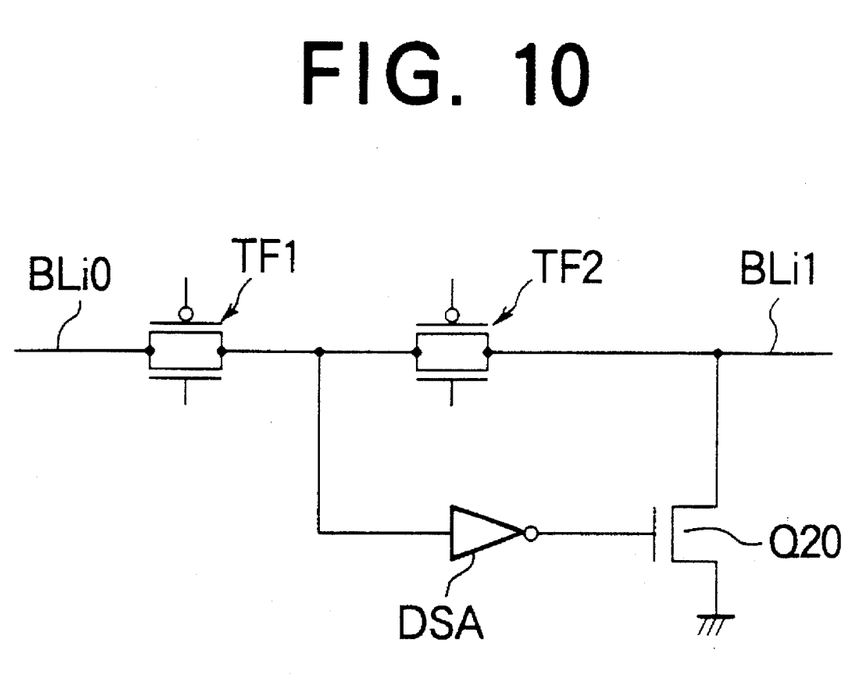
FIG. 10 is a circuit diagram of the configuration of a principal part of a semiconductor memory device according to a fifth embodiment of the present invention.

FIG. 10 is a circuit diagram of the configuration of a principal part of a fifth embodiment of the semiconductor memory device according to the present invention.

In FIG. 10, TF1 and TF2 denote transfer gates formed by connecting the drains and sources of the N-channel MOS transistor and the P-channel MOS transistor to each other; DSA denotes a differential amplification type sense amplifier; and Q20 denotes the N-channel MOS transistor used as the gate circuit.

The present embodiment has a structure corresponding to an apparatus in which the bit line is not precharged to ½$V_{cc}$, but precharged to the $V_{cc}$ level.

Namely, in the present apparatus, the constitution is made so that a bit line is precharged to the high level of the power supply voltage $V_{cc}$ level, the transistor Q20 is driven by the sense amplifier SA only when the low level (ground level) is transmitted, and the bit line BLi1 of the next stage is pulled in to the ground level.

Also, in the present embodiment, similar effects to those of the above-mentioned embodiments can be obtained.

As explained above, according to the present invention, it is possible to increase the speed of the sense operation and, at the same time, to reduce the charging current of the bit line and to suppress the power consumption.

What is claimed is:

1. A semiconductor memory device in which a transistor having a read gate construction is connected between a bit line and a data bus, comprising:

a control transistor which is coupled between a drain of the transistor having the read gate construction and a ground;

a read transistor which is coupled between the transistor having the read gate construction and the data bus and is turned on by a read request signal during a read operation and during a write operation; and a write transistor which is coupled between the bit line and the transistor having the read gate construction, is turned on by a write request signal, and performs the switching between the bit line and the read transistor, wherein said control transistor is turned off during a write operation of data.

2. A semiconductor memory device according to claim 1, wherein provision is made of:

control transistors which are coupled between the drains of transistors having the read gate construction, connected between bit lines and inverted bit lines and data buses, and the ground;

read transistors which are coupled between the transistors having the read gate construction and the data buses and are turned on by a read request signal during a read operation and during a write operation; and write transistors which are coupled at a stage in front of the transistors having the read gate construction described above, are turned on by a write request signal, and perform the switching between the bit lines and the inverted bit lines and the read transistors, wherein said control transistors are turned off during a write operation of data.

3. A semiconductor memory device wherein two bit lines are respectively segmented into a plurality of parts and connected to a plurality of memory arrays in block, comprising:

sense amplifiers connected respectively to each of the memory arrays;

switch means for connecting the bit lines belonging to adjoining memory arrays to each other; and gate means which are connected in parallel to the switch means with respect to the bit lines, wherein each block comprises a pair of said bit line parts corresponding to the two bit lines, respectively.

4. A semiconductor memory device according to claim 3, wherein every two adjoining memory arrays share sense amplifiers.

5. A semiconductor memory device according to claim 3, wherein the gate means are activated in an order of from the furthest side from an output port.

6. A semiconductor memory device according to claim 3, wherein the sense amplifier has two terminals for applying an operation voltage and a fixed voltage is applied across these two terminals.

7. A semiconductor memory device according to claim 3, wherein so as to set the potential of the bit lines to a first potential and then to selectively discharge the same to a second potential, a transistor is provided between each of the bit lines and the second potential, and the gate terminal of this transistor is controlled by the output of the sense amplifier.

8. A semiconductor memory device according to claim 4, wherein the gate means are activated in an order of from the furthest side from the output port.

9. A semiconductor memory device according to claim 4, wherein the sense amplifier has two terminals for applying an operation voltage and a fixed voltage is applied across these two terminals.

10. A semiconductor memory device according to claim 4, wherein so as to set the potential of the bit lines to a first potential and then to selectively discharge the same to a second potential, a transistor is coupled between each of the bit lines and the second potential, and the gate terminal of this transistor is controlled by the output of the sense amplifier.

11. A semiconductor memory device in which a transistor having a read gate construction is connected between a bit line and a data bus, comprising:

a control transistor which is coupled between a source of the transistor having the read gate construction and a ground;

a read transistor which is coupled between the transistor having the read gate construction and the data bus and is turned on by a read request signal during a read operation and during a write operation; and a write transistor Which is coupled between the bit line and the transistor having the read gate construction, is turned on by a write request signal, and performs the switching between the bit line and the read transistor, wherein said control transistor is turned off during a write operation of data.

12. A semiconductor memory device according to claim 11, wherein provision is made of:

control transistors which are coupled between the sources of transistors having the read gate construction, connected between bit lines and inverted bit lines and data buses, and the ground;

read transistors which are coupled between the transistors having the read gate construction and the data buses and are turned on by a read request signal during a read operation and during a write operation; and write transistors which are coupled at a stage in front of the transistors having the read gate construction described above, are turned on by a write request signal, and perform the switching between the bit lines and the inverted bit lines and the read transistors, wherein said control transistors are turned off during a write operation of data.

* * * * *